(12) United States Patent
Nakazato

(10) Patent No.: US 7,844,922 B2
(45) Date of Patent: Nov. 30, 2010

(54) SEMICONDUCTOR INTEGRATED CIRCUIT DEVICE AND DESIGN METHOD THEREOF

(75) Inventor: Satoshi Nakazato, Tokyo (JP)

(73) Assignee: Nec Corporation, Tokyo (JP)

( * ) Notice: Subject to any disclaimer, the term of this patent is extended or adjusted under 35 U.S.C. 154(b) by 43 days.

(21) Appl. No.: 11/369,957

(22) Filed: Mar. 8, 2006

(65) Prior Publication Data

US 2006/0202719 A1 Sep. 14, 2006

(30) Foreign Application Priority Data

Mar. 9, 2005 (JP) ............................. 2005-064718

(51) Int. Cl.
G06F 17/50 (2006.01)
(52) U.S. Cl. .............................................. 716/1; 716/5
(58) Field of Classification Search ..................... 716/1, 716/5, 6
See application file for complete search history.

(56) References Cited

U.S. PATENT DOCUMENTS

| | | | | |
|---|---|---|---|---|
| 5,883,814 A * | 3/1999 | Luk et al. | | 716/2 |
| 5,956,497 A * | 9/1999 | Ratzel et al. | | 716/1 |
| 6,266,803 B1 * | 7/2001 | Scherer et al. | | 716/12 |
| 6,437,441 B1 * | 8/2002 | Yamamoto | | 257/758 |
| 6,536,024 B1 * | 3/2003 | Hathaway | | 716/6 |
| 6,825,690 B1 * | 11/2004 | Kundu | | 326/41 |
| 6,898,683 B2 * | 5/2005 | Nakamura | | 711/167 |
| 7,017,132 B2 * | 3/2006 | Hou et al. | | 716/6 |
| 2003/0051221 A1 * | 3/2003 | Mizuno et al. | | 716/12 |
| 2005/0225365 A1 * | 10/2005 | Wood | | 327/141 |

FOREIGN PATENT DOCUMENTS

| | | |
|---|---|---|
| JP | 63-108814 A | 5/1988 |
| JP | 06-069468 A | 3/1994 |
| JP | 06-077426 A | 3/1994 |
| JP | 10-116916 A | 5/1998 |
| JP | 10-336015 A | 12/1998 |
| JP | 2001-156622 A | 6/2001 |
| JP | 2003-92350 A | 3/2003 |
| JP | 2003-248706 A | 9/2003 |

* cited by examiner

Primary Examiner—Jack Chiang
Assistant Examiner—Binh C Tat
(74) Attorney, Agent, or Firm—Sughrue Mion, PLLC (57) ABSTRACT

In a semiconductor integrated circuit device in which dynamic type logic circuit cells, in which transistors constituting a logic section are in an unconnected condition, are arranged in two-dimensional array form and wiring for distributing a clock signal to each row of these dynamic type logic circuit cells is provided, a logic function is allotted to the cells, the number of series connection stages of the cells within an evaluation period determined by a clock cycle of the clock signal is found, and a judgment is made as to whether restrictions can be met by arranging the cells on the semiconductor integrated circuit device and performing delay calculations in a case where the number of series connection stages does not exceed a prescribed number of stages. When the restrictions are met, the whole processing comes to an end. When the restrictions are not met, modifications are made.

18 Claims, 10 Drawing Sheets

SEMICONDUCTOR INTEGRATED CIRCUIT DEVICE AND DESIGN METHOD THEREOF

BACKGROUND OF THE INVENTION

1. Field of the Invention

The present invention relates to a semiconductor integrated circuit device and a design method of this semiconductor integrated circuit device and, more particularly, to a semiconductor integrated circuit device including a domino circuit cell array and a design method of this semiconductor integrated circuit device.

2. Related Art

In designing an LSI capable of high-speed operation, in a static circuit composed of usual CMOS circuits, the area occupied by the static circuit has become increasingly insufficient in terms of an integration degree. Particularly, in designing a processor which operates at frequencies exceeding 1 GHz or the like, this situation becomes especially remarkable. For this reason, in such designing, a dynamic circuit is often used in place of a static circuit. A domino circuit is widely known as one of such dynamic circuits and an increasing number of domino circuits have been field proven (refer to the Japanese Patent Laid-Open No. 63-108814 and the Japanese Patent Laid-Open No. 10-336015).

However, almost all designing using a domino circuit has hitherto been manually performed. This is ascribed to design problems peculiar to a domino circuit which are different from those of a static circuit. One of the problems is as follows. That is, after the design of a fundamental cell circuit (which may sometimes be called a primitive block), in the case of a static circuit, it is necessary to verify only a DC noise margin, whereas in the case of a domino circuit, it is necessary to perform multiple verifications of an AC noise margin, precharge time, a charge share, etc. in addition to the verification of a DC noise margin.

As a result of this, in the case of a domino circuit, design items are not prepared as a standard library unlike the case of a static circuit and, it is necessary for the designer to prepare all design items that require verification and to verify them. Compared to a static circuit, a domino circuit is weak in noise and has a high possibility of wrong logic actions. In addition, unlike the case of a static circuit, it is necessary to distribute clocks for dynamic action to all domino circuit cells. After the verification of delays is performed after the completion of layout design, it is necessary to determine clocks to be distributed while checking restrictions for a delay time for each domino circuit stage and for a required clock cycle. Therefore, modifications and amounts of turning back become large when delay restrictions cannot be met.

Design methods of a semiconductor integrated circuit including the above-described domino circuit cell array have problems as described below. The first problem is that because domino circuit designing which has thitherto been performed is based on manual design, the automation of design is difficult. The second problem is that because of the difficulty of the automation of design, the scope of application of a domino circuit is limited to narrow places and applicable places cannot be expanded to a wider range.

BRIEF SUMMARY OF THE INVENTION

The object of the present invention is to provide a semiconductor integrated circuit device including a domino circuit suitable for the automation of design and a design method of this semiconductor integrated circuit device by expanding applications of a domino circuit so that an LSI capable of higher-speed operation can be designed.

A semiconductor integrated circuit device of the present invention includes a two-dimensional array of dynamic type logic circuit cells in which transistors constituting a logic section are in an unconnected condition and wiring for distributing a clock signal to each row of these dynamic type logic circuit cells.

A design method of a semiconductor integrated circuit device of the present invention is a design method of a semiconductor integrated circuit device in which dynamic type logic circuit cells, in which transistors constituting a logic section are in an unconnected condition, are arranged in two-dimensional array form and wiring for distributing a clock signal to each row of these dynamic type logic circuit cells is provided. This design method includes: a step of allocating a logic function to each of the cells; a step of finding the number of series connection stages of the cells within an evaluation period determined by a clock cycle of the clock signal; and a step of performing delay calculations by arranging the cells on the semiconductor integrated circuit device in a case where the number of series connection stages does not exceed a prescribed number of stages.

A program of the present invention is a program for causing a computer to execute a design method of a semiconductor integrated circuit device in which dynamic type logic circuit cells, in which transistors constituting a logic section are in an unconnected condition, are arranged in two-dimensional array form and wiring for distributing a clock signal to each row of these dynamic type logic circuit cells is provided. This program includes: processing for allocating a logic function to each of the cells; processing for finding the number of series connection stages of the cells within an evaluation period determined by a clock cycle of the clock signal; and processing for performing delay calculations by arranging the cells on the semiconductor integrated circuit device in a case where the number of series connection stages does not exceed a prescribed number of stages.

The operation of the present invention will be described. With respect to a domino circuit which has been field proven especially frequently among the CMOS dynamic circuits known as circuits which operate at high speeds, unwired domino circuit cells for which multiple kinds of circuit structures can be adopted are formed beforehand in two-dimensional array form on a semiconductor integrated circuit, and clock signals which are necessary for each domino circuit cell row are distributed and wired beforehand.

As a design method of this semiconductor integrated circuit, a maximum delay time is found beforehand among various kinds of logic configurations capable of realizing domino circuit cells, and a judgment is made beforehand as to whether delay restrictions can be met from the maximum number of domino circuit stages in a clock cycle after logic synthesis and optimization, whereby delay improvements by modifications of the RTL (resister transfer level) are made before arrangement and wiring.

Furthermore, the transistor configurations of a precharge PMOS section and a clock gating NMOS section are also made variable beforehand, and wires are added later so that circuit rule restrictions peculiar to a domino circuit, such as precharge time and charge share, are met according to the connection condition of NMOS transistors of a NMOS logic section. As described above, in the present invention, the designing using a domino circuit can be automated and, therefore, it is possible to design a higher-speed LSI by using a domino circuit having a scope of application which has hitherto been limited, in a wider range.

DETAILED DESCRIPTION OF THE PREFERRED EMBODIMENTS

Figure 1:
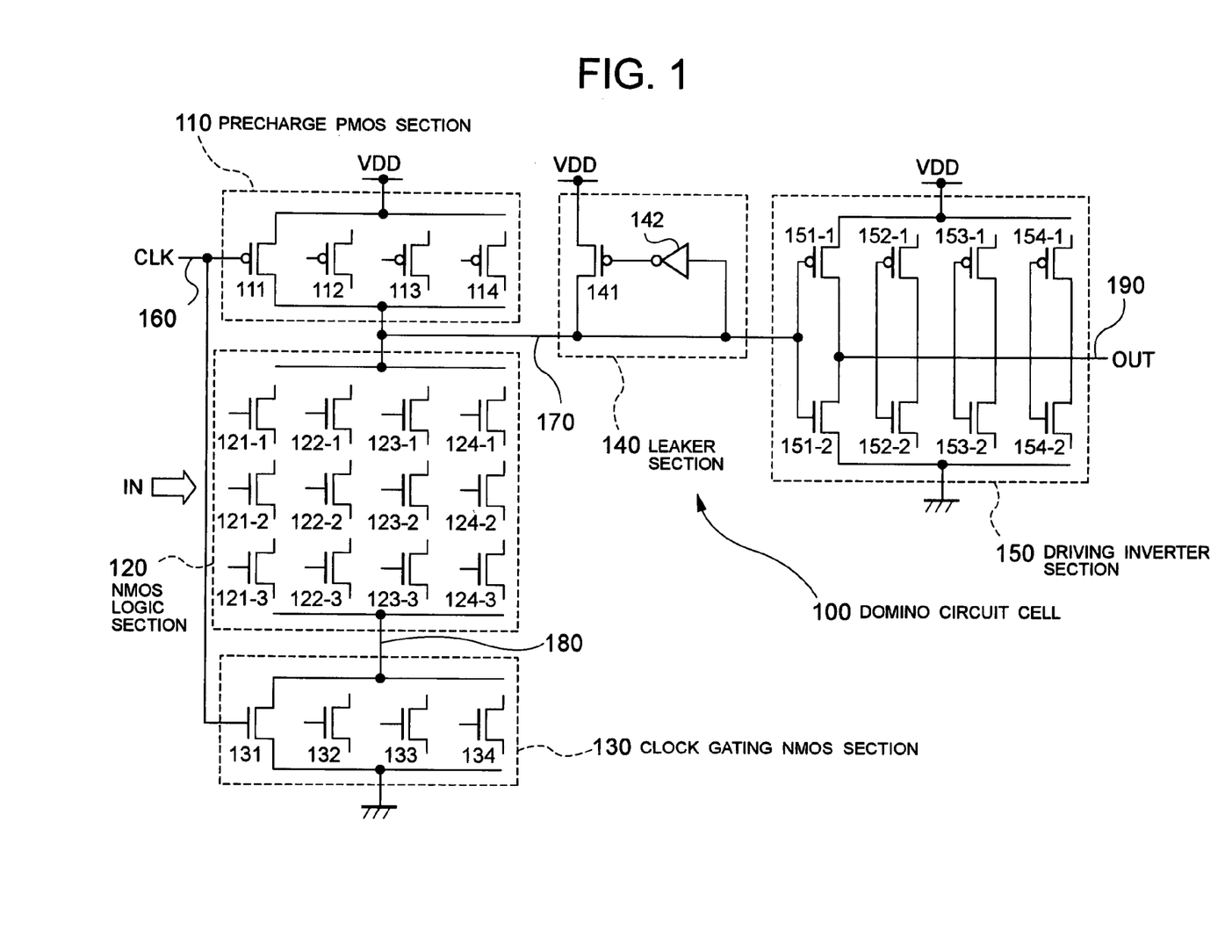
FIG. 1 is a diagram which shows a domino circuit cell according to an embodiment of the present invention.

Hereinafter, embodiments of the present invention will be described in detail with reference to the accompanying drawings. FIG. 1 shows a domino circuit cell 100 according to an embodiment of the present invention. In FIG. 1, a precharge PMOS section 110 is constituted by multiple PMOS transistors 111 to 114, and among the transistors, only one PMOS transistor 111 is connected to a power source VDD and a NMOS logic section 120 via a connection node 170. A gate electrode of the PMOS transistor 111 is connected to a clock signal 160.

The NMOS logic section 120 is constituted by multiple NMOS transistors 121-1 to 121-3, 122-1 to 122-3, 123-1 to 123-3, 124-1 to 124-3, and all of these NMOS transistors are in an unconnected condition. Incidentally, a gate electrode in each of the NMOS transistors of the NMOS logic section 120 can become an input signal of the domino circuit cell 100.

A clock gating NMOS section 130 is connected between the NMOS logic section 120 and a ground GND and constituted by multiple NMOS transistors 131 to 134. Among the transistors, only one transistor 131 is connected to the ground GND and the NMOS logic section 120 via a connection node 180. The connection node 170 between the precharge PMOS section 110 and the NMOS logic section 120 is also called a charge node. The charge node 170 is further connected to a leaker section 140 and a diving inverter section 150.

When the clock signal 160 is at a low level, the PMOS transistor of the precharge PMOS section 110 comes into an on-condition, and the NMOS transistor of the clock gating NMOS section 130 comes into an off-condition. For this reason, regardless of the condition of the input signal of the NMOS logic section 120, the charge node 170 is connected to the power source VDD and charged at a high level. When the clock signal 160 is at a high level, conversely the precharge PMOS section 110 comes into an off-condition and the clock gating NMOS section 130 comes into an on-condition. And according to the condition of the NMOS logic section 120, a decision is made as to whether the charge node 170 maintains a high level or is discharged at a low level.

At this time, if noise appears on the input signal of the NMOS logic section 120, then the charge node 170 is unintendedly discharged at a low level and there is a possibility that the NMOS logic section 120 may perform wrong actions. Therefore, the leaker section 140 is connected to the charge node 170 and operates so as to maintain a high level by preventing such wrong actions. In the leaker section 140, a PMOS transistor 141 is connected between the charge node 170 and the power source VDD, and to a gate electrode of this PMOS transistor 141 is connected an output of a logic inversion circuit 142 (hereinafter referred to as an "inverter") which uses the charge node 170 as an input. As a result of this, the PMOS transistor 141 is in an on-condition while the charge node 170 is at a high level, and even when the charge node 170 is going to discharge at a low level, the charge node 170 is recharged by the PMOS transistor 141.

In a case where the NMOS logic section 120 is going to logically discharge the charge node 170 depending on the input signal of the NMOS logic section 120, by designing the NMOS logic section 120 so as to discharge with a larger current driving force than that of the PMOS transistor 141 of the leaker section 140, it is ensured that a discrimination can be made between a wrong action by noise and a logic action. For a logic value of the charge node 170, an output signal 190 is transmitted to a logic circuit of the next stage by causing the driving inverter section 150 to drive the output signal 190 of the domino circuit cell 100.

The driving inverter section 150 is constituted by multiple inverters which are constituted by pairs of PMOS transistors 151-1, 152-1, 153-1, 154-1 and NMOS transistors 151-2, 152-2, 153-2, 154-2. Among the transistors, only one PMOS transistor 151-1 is connected to the power source VDD and only one NMOS transistor 151-2 is connected to the ground GND. And the inverter is constituted by using a connection node between the PMOS transistor 151-1 and the NMOS transistor 151-2 as the output signal 190 of the domino circuit cell 100.

Figure 2:
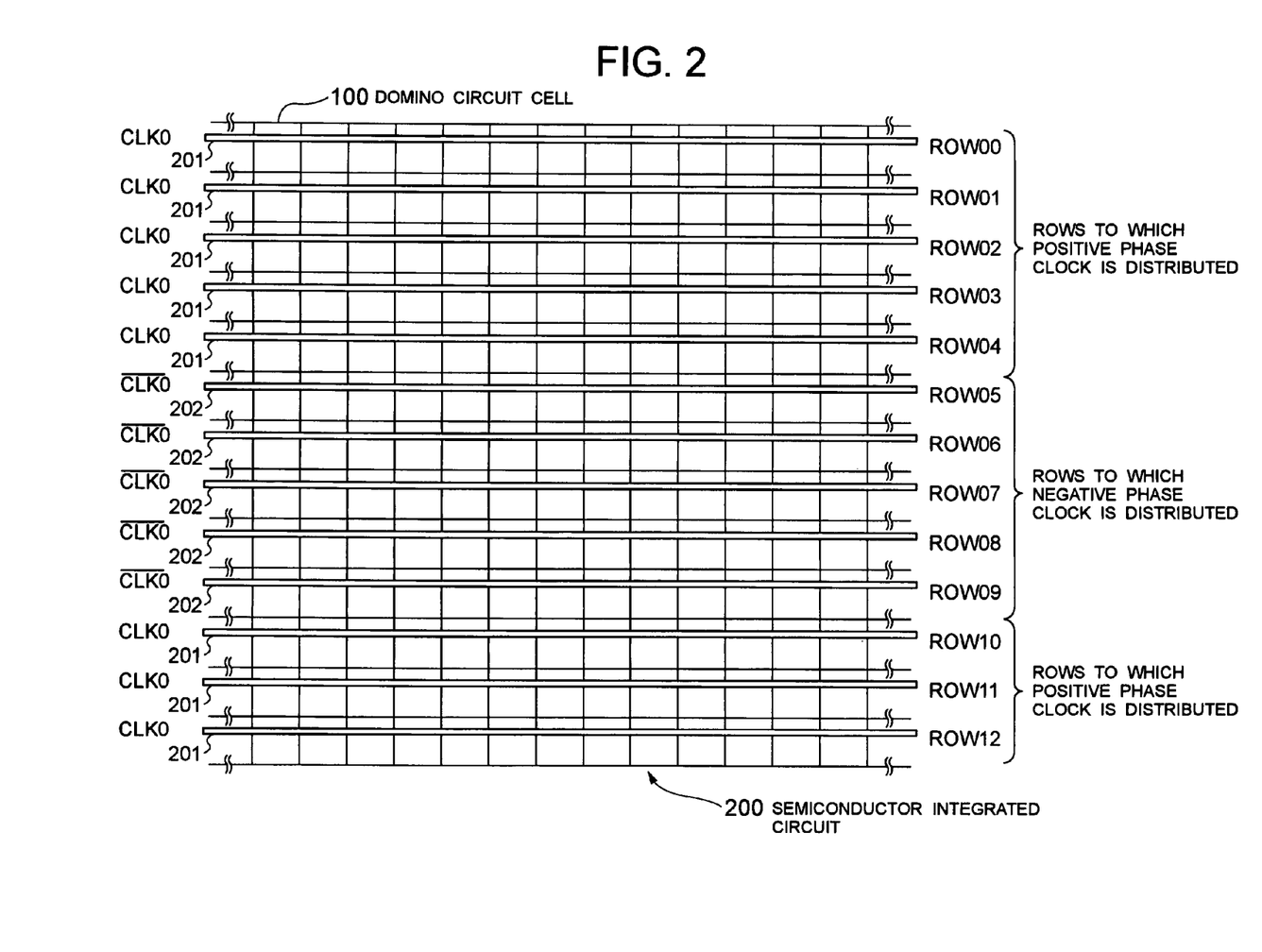
FIG. 2 is a diagram which shows an example of a semiconductor integrated circuit in which the domino circuit cells according to the embodiment of the present invention are arranged in two-dimensional array form.

FIG. 2 shows a semiconductor integrated circuit 200 in which the domino circuit cell 100 shown in FIG. 1 is arranged in two-dimensional array form. For the sake of convenience, in FIG. 2 are illustrated 13 rows from ROW00 to ROW12. Domino circuit cells 100 are arrayed in each row. Each of the domino circuit cells 100 is fabricated by using a front-end layer constituting transistors and a wiring layer which is a first layer in the semiconductor process. On each row, a clock wire 201 or 202 is linearly arranged by use of a wiring layer which is a second layer and connected to the clock input terminal of each of the domino circuit cells 100.

Figure 3:
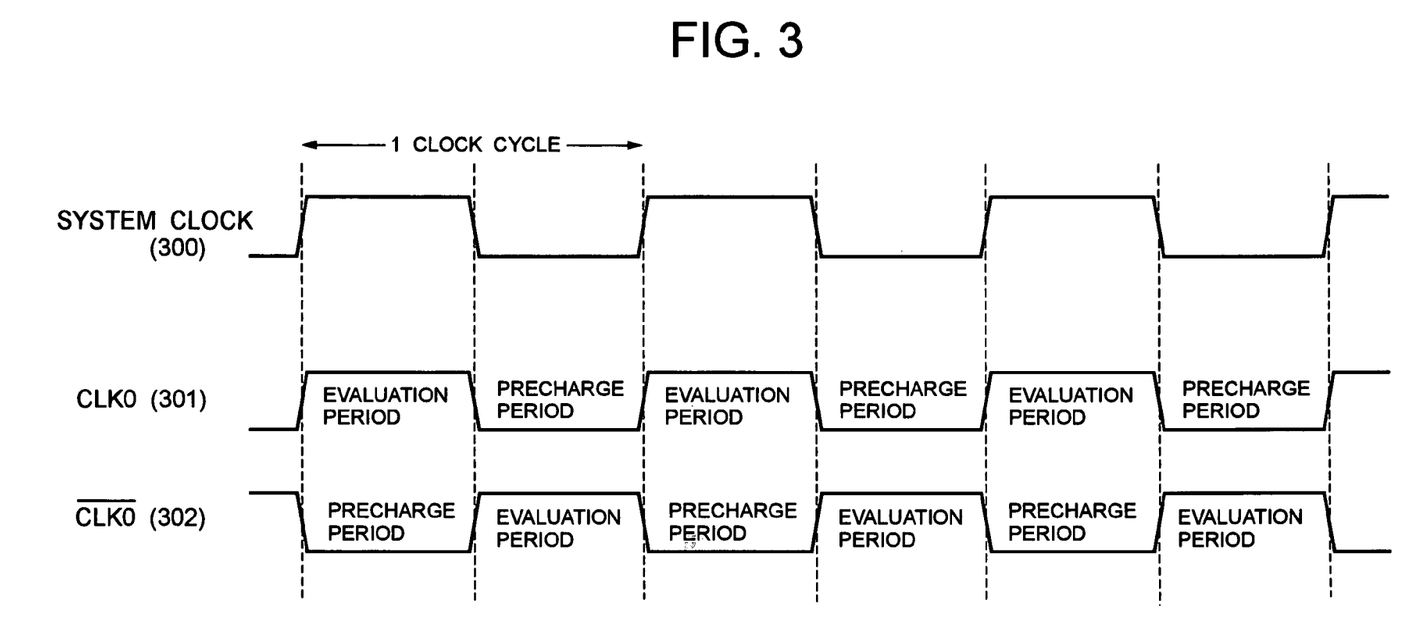
FIG. 3 is a diagram which shows the waveforms of clock signals transmitted to clock wires shown in FIG. 2.

FIG. 3 shows clock signals transmitted to the clock wires 201, 202 shown in FIG. 2. A system clock signal 300, an in-phase clock signal 301 and a negative-phase clock signal 302 are used as clock signals supplied to the domino circuit cells. Even when any one of the clock signals is connected, the domino circuit cell charges the charge node at a high level in a precharge period while the clock signal is at a low level, whereas while the clock signal is at a high level, the domino circuit cell performs either of the actions of maintaining the charge node at a high level or discharging the charge node at a low level depending on the state of the input signal of the domino circuit cell as an evaluation period.

In the semiconductor integrated circuit 200 shown in FIG. 2, wiring is performed by distributing the positive-phase clock signal 201 to the rows ROW00 to ROW04 and ROW10 to ROW12 and the negative-phase clock signal 202 to the rows ROW05 to ROW09.

In the above-described semiconductor integrated circuit 200, it is possible to realize a desired logic function by adding wiring of each of the domino circuits 100 and wiring which connects the domino cells 100 together by using the wiring layers.

Although the configuration of the embodiment was described above in detail, the number of the MOS transistors included in each of the precharge PMOS section 110, the NMOS logic section 120, the clock gating NMOS section 130 and the driving inverter section 150, is not limited to the number of the MOS transistors shown in FIG. 1.

For the configuration of the leaker section 140, in FIG. 1, the gate electrode of the PMOS transistor 141 is driven by the inverter 142 which uses the charge node 170 as an input. However, a configuration of a domino circuit cell in which the inverter 142 of the leaker section 140 is removed by directly driving the gate electrode of the PMOS transistor 141 by the output signal 190 of the driving inverter section 150 is known well to those skilled in the art, and such a circuit modification is not directly related to the contents of the present invention.

Similarly, a configuration of a domino circuit cell in which the connection node 180 between the NMOS logic section 120 and the clock gating NMOS section 130 is directly connected to the ground GND without providing the clock gating NMOS section 130 is also known well to those skilled in the art.

Also, in the semiconductor integrated circuit 200 shown in FIG. 2, for the domino circuit cells arranged in two-dimensional array form, a difference in configuration as to whether the domino circuit cells are arranged by providing spaces between the rows and between the cells is not directly related to the contents of the present invention. That each of the clock phases is connected to how many domino circuit cell rows depends on the object of design and should be freely set, is also clear to those skilled in the art and is not limited by the number of rows illustrated in FIG. 2.

Next, a design method of the semiconductor integrated circuit 200 of FIG. 2 in which the domino circuit cell 100 of FIG. 1 is used will be described with reference to the flowchart shown in FIG. 4. In the design method, designing is performed by the following steps.

1. The RTL is prepared (Step 401). In general, the RTL is prepared by using a description language, such as Verilog and VHDL (VHSIC hardware description language).

2. The RTL is converted to a logical formula by logic synthesis/optimization (Step 402). Because the domino circuit is a circuit of positive logic, attention should be paid to the fact that this logic is different from a negative logic of a usual CMOS static circuit. It is necessary that the results of logic synthesis/optimization be expressed in a logical formula of positive logic.

3. The connection configuration of the NMOS transistors in the NMOS logic section of the domino circuit cell is determined from the logical formula of positive logic (Step 403). At this time, a possible maximum configuration of the NMOS logic section of the domino circuit cell is limited beforehand. This means that for the NMOS transistors, several kinds of combinations of a maximum number of stages of longitudinal stacking and a maximum number of parallel rows are set beforehand. For example, the specification is as follows: in the case of 4 stages of longitudinal stacking, the maximum number of parallel rows is 3 rows; in the case of 3 stages of longitudinal stacking, the maximum number of parallel rows is 4 rows; in the case of 2 stages of longitudinal stacking, the maximum number of parallel rows is 6 rows; in the case of 1 stage of longitudinal stacking, the maximum number of parallel rows is 8 rows; and the like.

4. The number of the parallel PMOS transistors of the precharge PMOS section is determined in accordance with the rule from the configuration of the NMOS logic section of each domino circuit cell determined in Step 403 (Step 404). In a case where the number of stages of longitudinally stacked NMOS transistors of the NMOS logic section is small and the number of parallel rows of the transistors is large, a capacitance value connected to the charge node is seemingly large in terms of equivalence. Therefore, in order to keep the precharge time within a specific time, it is necessary to increase parallel rows of the PMOS transistors of the precharge PMOS section.

5. The number of the parallel NMOS transistors of the clock gating NMOS section is determined in accordance with the rule from the configuration of the NMOS logic section of each domino circuit cell determined in Step 403 (Step 405). In a case where the number of stages of longitudinally stacked NMOS transistors of the NMOS logic section is large and the number of parallel rows of the transistors is small, the discharge current driving force for the charge node of the NMOS logic section becomes small. Therefore, in order to shorten the delay time of the domino circuit cell by shortening the discharge time of the charge node, it is necessary to increase parallel rows of the NMOS transistors of the clock gating NMOS section.

6. A maximum number of the stages of series connection within the same evaluation period (0.5 clock cycle) of the domino circuit cells connected to each clock signal is calculated (Step 406).

7. By using the delay time in the maximum configuration of the NMOS logic section limited beforehand in Step 403, a judgment is made as to whether the maximum number of stages of domino circuit cells within the evaluation period calculated in Step 406 can be kept within 50% of the clock cycle (Step 407). When the maximum number is not kept within 50%, there is a high possibility that the delay time restrictions cannot be met. Therefore, the processing returns to Step 401, where a modification of RTL, i.e., a modification of the logic configuration is made.

8. In a case where in Step 407 the maximum number of stages of domino circuit cells is kept within a specified number of stages derived from a required clock cycle, each of the domino circuit cells is arranged on a semiconductor integrated circuit arranged in two-dimensional array form (Step 408).

9. The connection wiring length between the domino circuit cells is calculated from the results of the arrangement in Step 408 (Step 409).

10. A necessary driving force is found in consideration of waveform blunting limits and delay time restrictions in accordance with the connection wiring length between the domino circuit cells calculated in Step 409, and the number of parallel inverters of the driving inverter section of each domino circuit cell is determined (Step 410).

11. Because with the above-described steps, the incorporation of a necessary logic function in the semiconductor integrated circuit and wiring thereon are completed, detailed delay calculations are performed (Step 411).

12. When the delay meets the restrictions (Step 412), the processing comes to an end. If the delay does not meet the restrictions (Step 412), the processing returns to Step 408, where the arrangement of each domino circuit cell is modified or the processing returns to Step 401, where a modification of the RTL is made.

By executing the above-described steps, the logic function can be realized on the domino circuit cells arranged in two-dimensional array form.

Figure 5:
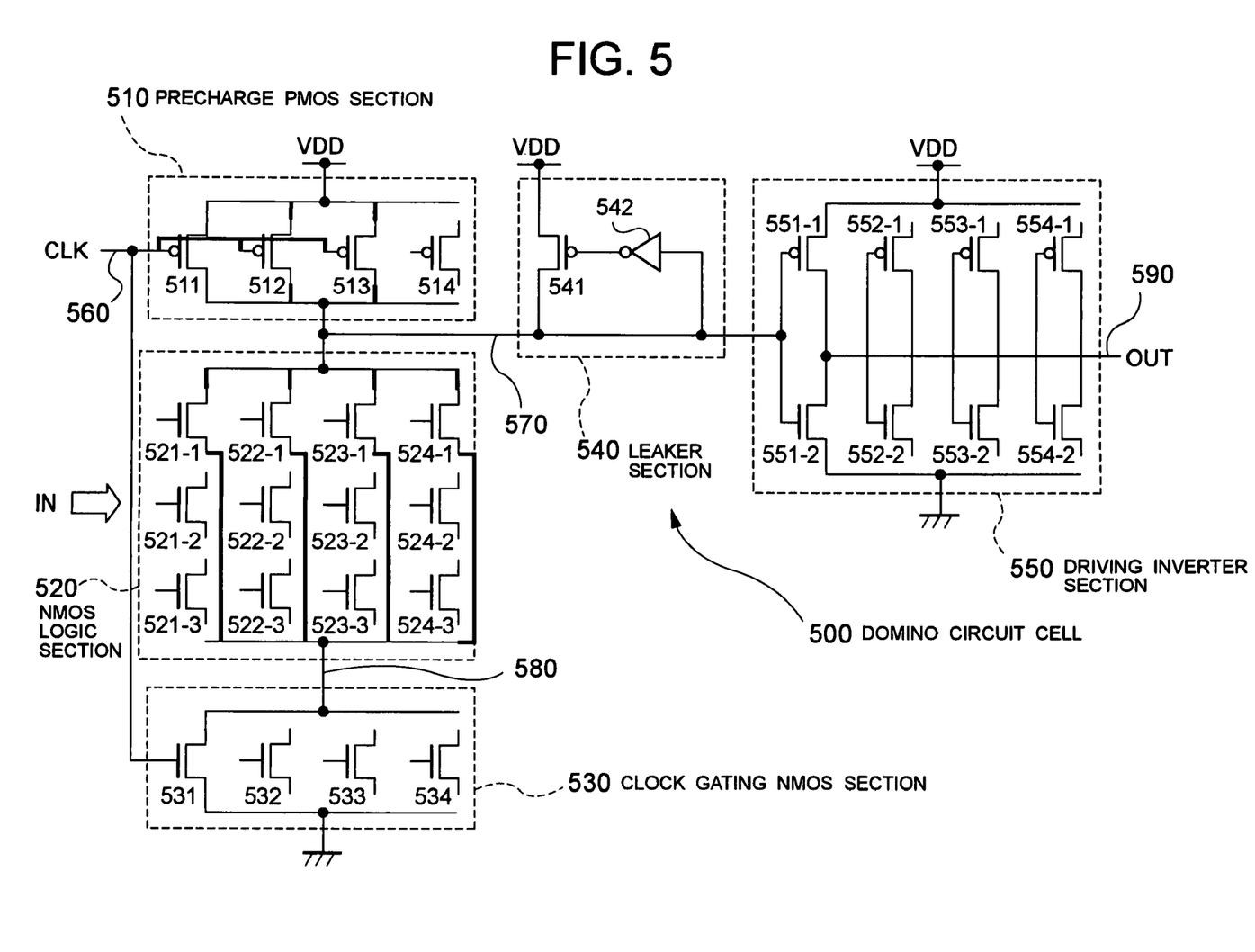
FIG. 5 is a diagram which shows an example in which a logic function is realized by performing wiring within the domino circuit cell.

Part of the design method using the above-described steps will be described in detail with reference to drawings. FIG. 5 shows an example in which a logic function is realized by performing wiring within a domino circuit cell. In FIG. 5, for an NMOS logic section 520 of a domino circuit cell 500, four NMOS transistors 521-1 to 524-1 are each connected to a charge node 570. These four NMOS transistors 521-1 to 524-1 are each connected also to a connection node 580 for connection to a clock gating NMOS section 530.

Figure 4:
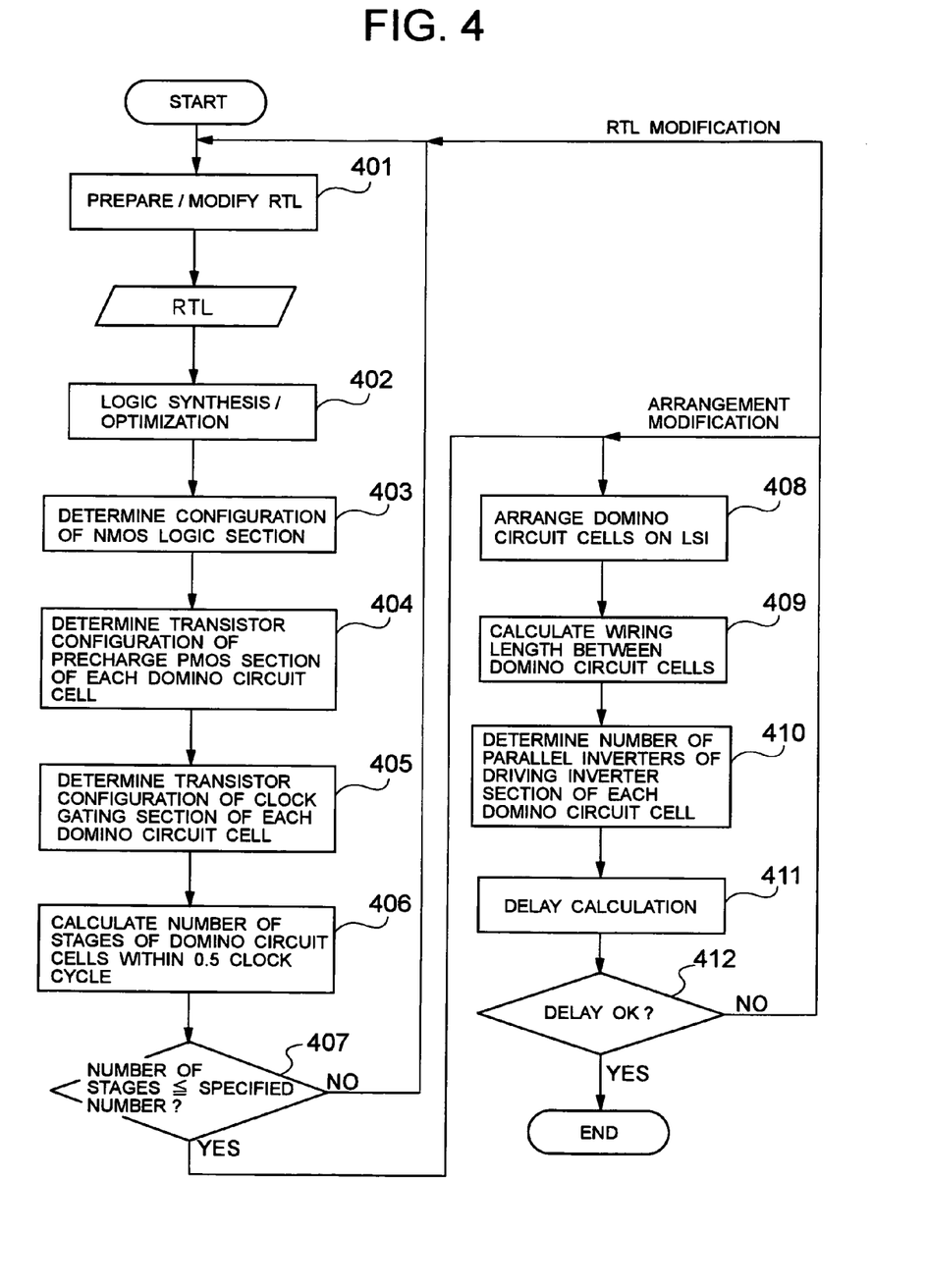
FIG. 4 is a flowchart which shows a design method of a semiconductor integrated circuit shown in FIG. 2.

This connection wiring within the NMOS logic section 520 is the result of the execution of Step 403 in the flowchart of FIG. 4. Gate electrodes of the four NMOS transistors 521-1 to 524-1 become input signals of the domino circuit cell 500, and the domino circuit cell 500 can realize an OR function for the four input signals. When the circuit configuration of the NMOS logic section 520 has been determined, by executing Step 404 in the flowchart of FIG. 4, two PMOS transistors 512 and 513 of a precharge PMOS section 510 are newly connected to a power source VDD and a charge node 570.

The circuit configuration of the NMOS logic section 520 is such that the number of stages of longitudinally stacked NMOS transistors is one stage and that the number of parallel rows is 4 rows, and the capacitance value of the charge node 570 is large. Therefore, this is the result of an increase in the number of parallel rows of the PMOS transistors of the precharge PMOS section 510 to 3 rows from the original one row. Furthermore, by executing Step 405 in the flowchart of FIG. 4, the number of parallel rows of the NMOS transistors of the clock gating NMOS section 530 is determined.

In the example of the domino circuit cell of FIG. 5, the number of longitudinally stacked stages of the NMOS transistors is one stage in the circuit configuration of the NMOS logic section 520. Therefore, the number of parallel rows of the NMOS transistors in the clock gating NMOS section 530 remains to be one row as initially and new wiring does not occur.

Figure 6:
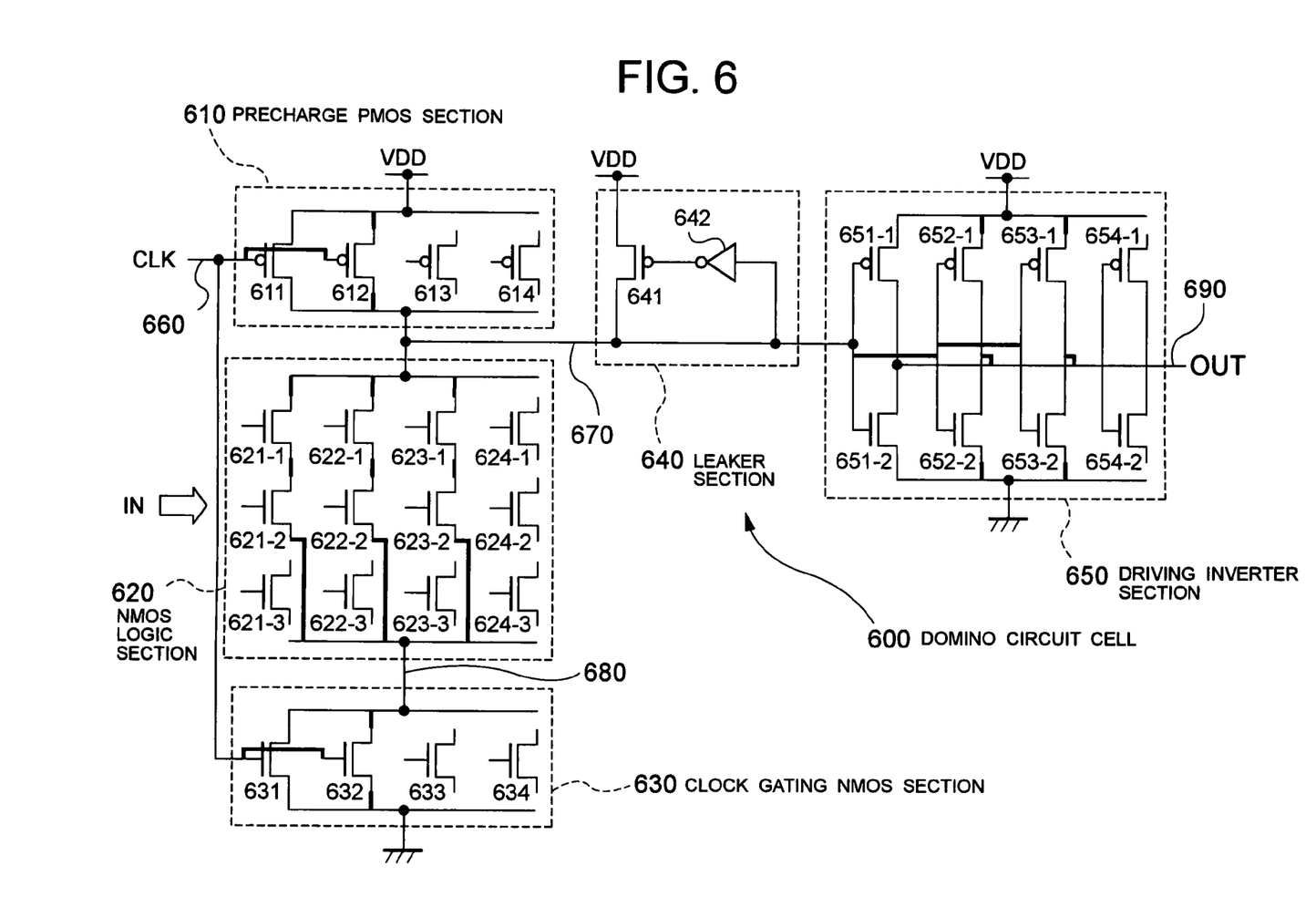
FIG. 6 is a diagram which shows another example in which a logic function is realized by performing wiring within the domino circuit cell.

FIG. 6 shows wiring within a domino circuit cell 600 to realize another logic function. In FIG. 6, an NMOS logic section 620 has a circuit configuration in which three sets of NMOS transistor, each set consisting of two NMOS transistors 621-1 and 621-2, 622-1 and 622-2, and 623-1 and 623-2, which are longitudinally stacked and connected. Gate electrodes of the six NMOS transistors 621-1, 621-2, 622-1, 622-2, 623-1, 623-2 become input signals of the domino circuit cell 600. If these input signals are denoted by A to F in order, then the domino circuit cell 600 can realize a logic function of "A*B+C*D+E*F" ("*" denotes a logical product and "+" denotes a logical sum).

In the precharge PMOS section 610, wiring is added so that a PMOS transistor 612 is newly connected to a power source VDD and a charge node 670 in consideration of the configuration of the NMOS logic section 620. Also in a clock gating NMOS section 630, wiring is similarly added so that a NMOS transistor 632 is newly connected to a connection node 680 for connection to the NMOS logic section 620 and a ground GND. In the same manner as the description related to FIG. 5, these are realized by executing the processing from Step 403 to Step 405 in the flowchart of FIG. 4.

Incidentally, the above-described numbers of parallel rows of the precharge PMOS section and the clock gating NMOS section are values defined for the sake of convenience and are not directly related to the circuit configuration of the NMOS logic section in the above description. The number of parallel rows is a value to be determined by performing a closer verification, and obviously, it is necessary to set the number of parallel rows at an optimum value according to a semiconductor process to be adopted and environmental conditions such as temperature and voltage.

Figure 7:
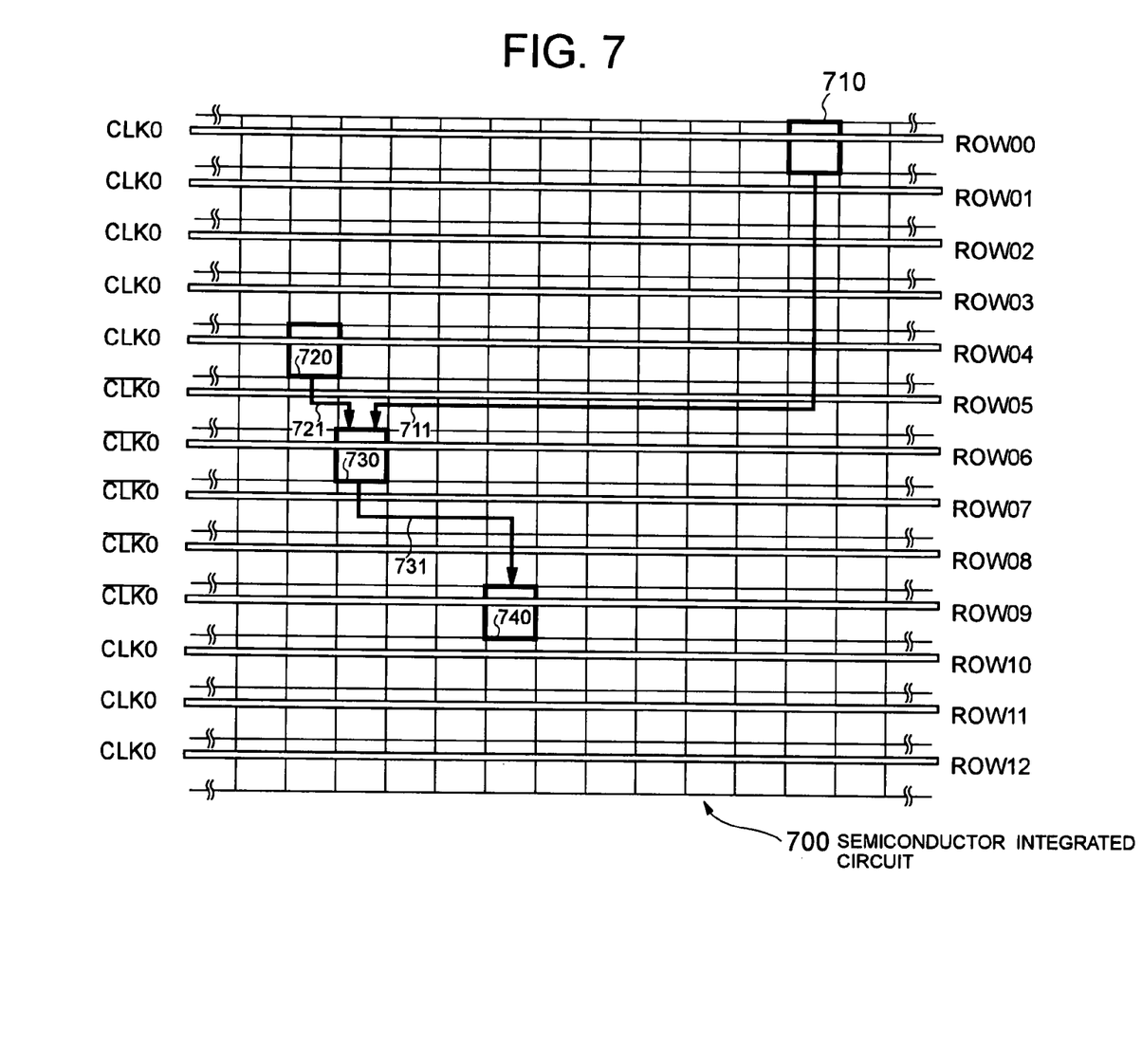
FIG. 7 is a diagram which shows how domino circuit cells in which a logic function has been actually realized are arranged on a semiconductor integrated circuit in which the domino circuit cells are arranged in two-dimensional array form.

FIG. 7 shows how domino circuit cells in which a logic function has been actually realized are arranged on a semiconductor integrated circuit 700 in which domino circuit cells are arranged in two-dimensional array form. In FIG. 7, four domino circuit cells 710, 720, 730 and 740 (referred to respectively as the domino circuit cell A, the domino circuit cell B, the domino circuit cell C, and the domino circuit cell D) are arranged. Among these, a positive-phase clock signal is distributed and connected to the two domino circuit cells 710 and 720 and a negative-phase clock signal is distributed and connected to the remaining two domino circuit cells 730 and 740.

The arrangement of the domino circuit cells on such a semiconductor integrated circuit is realized by executing Step 408 in the flowchart of FIG. 4. And by executing Step 409, the wiring length can be calculated by tracing wires 711, 721 and 731 between the domino circuit cells. When the wiring length between the domino circuit cells has been calculated, Step 410 in the flowchart of FIG. 4 is executed, whereby the number of parallel inverters of the driving inverter section of each domino circuit cell is determined and wiring according to this number is added.

For example, because in FIG. 7 the wire 721 between the domino circuit cell B (720) and the domino circuit cell C (730) has a relatively short wiring length, it is possible to use the initial number of inverter connection of one as in the driving inverter section 550 of the domino circuit cell 500 shown in FIG. 5. Because the wire 711 between the domino circuit cell A (710) and the domino circuit cell C (730) has a relatively long wiring length, as in the driving inverter section 650 of the domino circuit cell 600 shown in FIG. 6, transistors 652-1, 652-2, 653-1 and 653-2 which constitute two inverters are newly connected to the power source VDD, the ground GND, the charge node 670 and the output signal 690, thereby to increase the driving force.

By repeating the processing as described above, a semiconductor integrated circuit including the domino circuit cell of the present invention can be designed and the automation of design is possible for each of the steps shown in the flowchart of FIG. 4.

Figure 8:
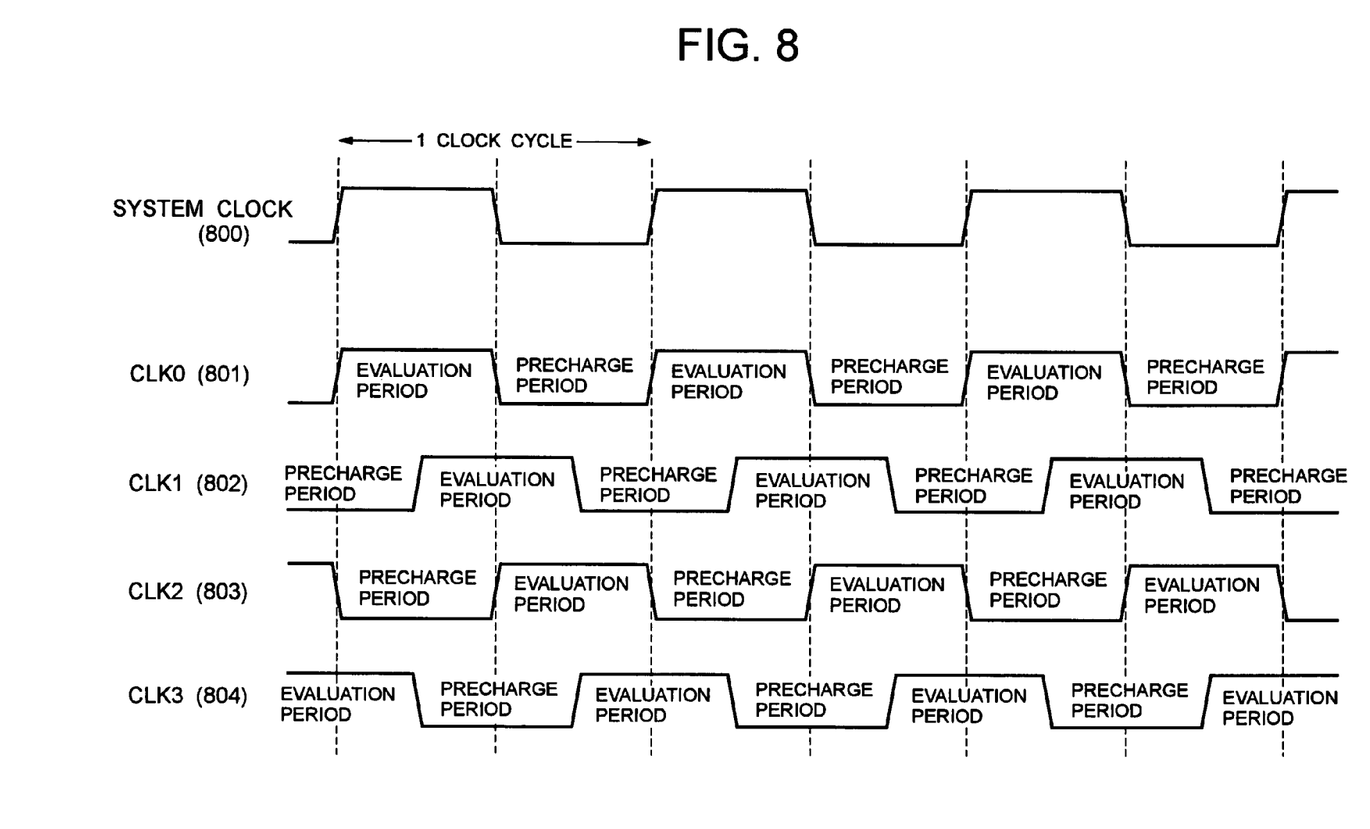
FIG. 8 is a diagram which shows examples of waveforms of four-phase clock signals.

As another embodiment of the present invention, there is presented an embodiment in which the basic configuration is the same as above, but for clock signals which are supplied to domino circuit cells, four-phase clock signals overlapping each other is used. FIG. 8 shows four-phase clock signals overlapping each other. For a system clock 800, there are used an in-phase clock signal CLK0 (801), a clock signal CLK1 (802) having a phase which delays 90 degrees, a clock signal CLK2 (803) having a phase which delays 180 degrees, and a clock signal CLK3 (804) having a phase which delays 270 degrees.

In clock signals of CLK0 and CLK1, CLK1 and CLK2, CLK2 and CLK3, CLK3 and CLK0, which are adjacent to each other, the evaluation periods of domino circuits in which the clocks are at a high level, overlap each other by ¼ of the cycle. In a case where such over lapping clock signals are used, by performing delay design in such a manner that signal transmission from a domino circuit cell operating in a clock phase to a domino circuit cell operating in the next clock phase is performed within the overlapping evaluation periods, it is possible to cancel factors for delay worsening caused by clock signals, such as clock skew and jitter, and this provides the advantage that even when delay time in a specific clock cycle cannot meet limits, the operation becomes possible if a value of delay time as a total of all stages of domino circuit cells meets specified delay time restrictions.

For this reason, compared to the above-described domino circuit using the two-phase clock signals and a usual static CMOS circuit, it is possible to incorporate many logic functions in the same clock cycle and to realize high operating frequencies to realize the same logic function.

Figure 9:
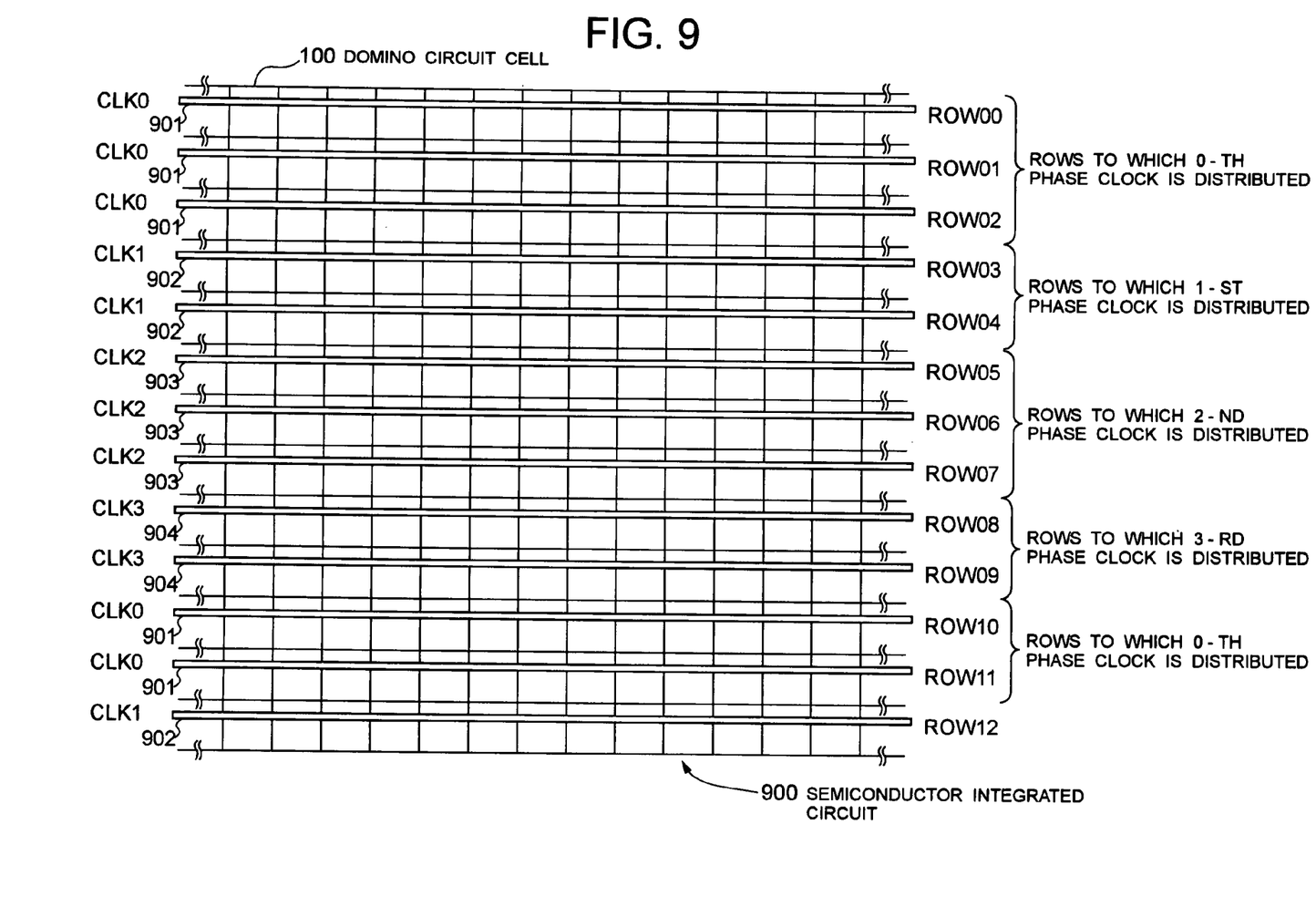
FIG. 9 is a diagram which shows an example of a semiconductor integrated circuit in which the domino circuit cells according to the embodiment of the present invention are arranged in two-dimensional array form and four-phase clock signals are wired.

FIG. 9 shows a semiconductor integrated circuit 900 in which domino circuit cells are arranged in two-dimensional array form and four-phase clock signals are wired. Wires 901 to which the clock signal CLK0 having the same phase as that of the system clock is distributed are present in the rows ROW00 to ROW02 and the rows ROW10 and ROW11. Wires 902 to which the clock signal CLK1 having a phase which delays 90 degrees from the system clock is distributed are present in the rows ROW03, ROW04 and ROW12. Wires 903 to which the clock signal CLK2 having a phase which delays 180 degrees from the system clock is distributed a represent in the rows ROW05 to ROW07. Wires 904 to which the clock signal CLK3 having a phase which delays 270 degrees from the system clock is distributed are present in the rows ROW08 and ROW09.

Figure 10:
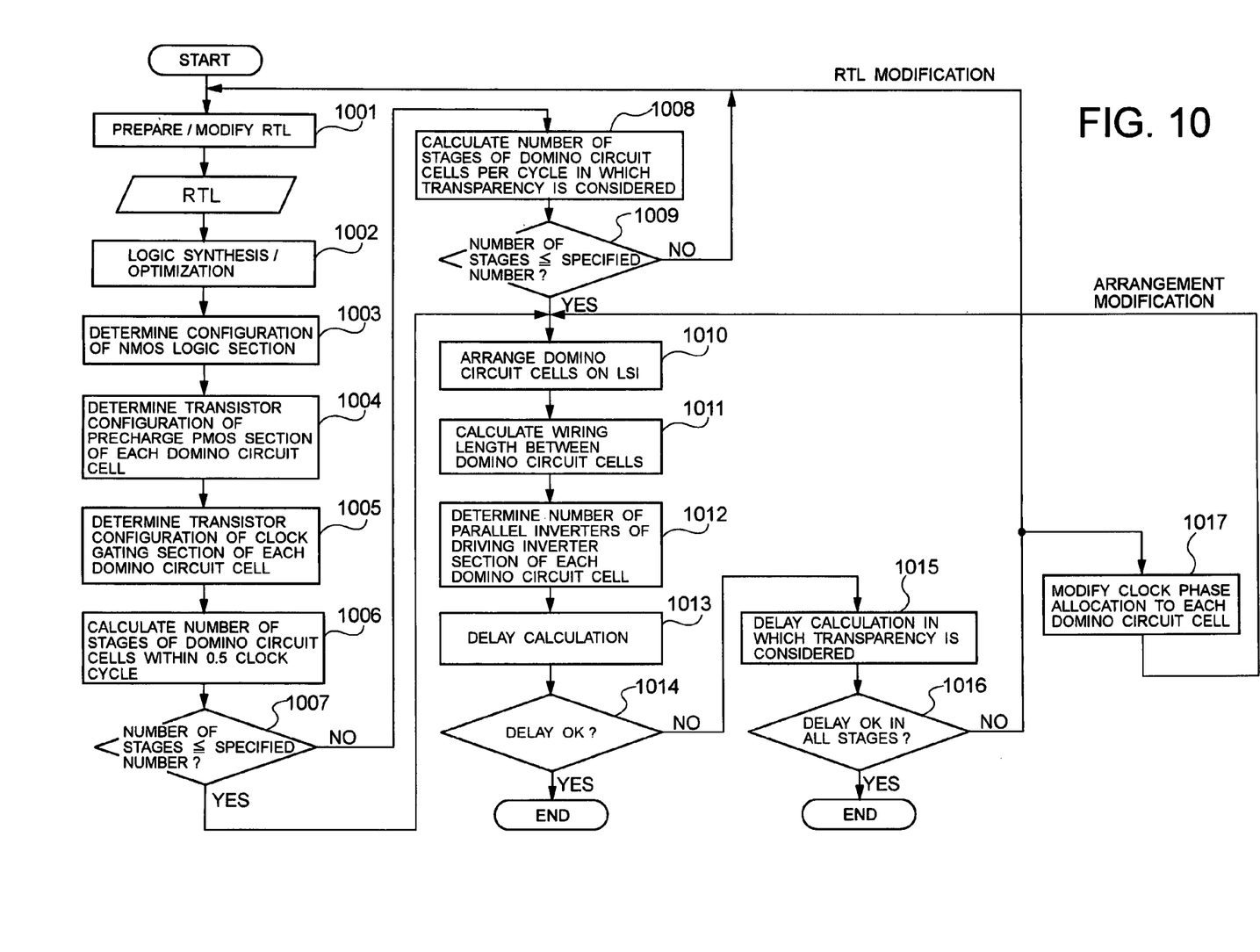
FIG. 10 is a flowchart which shows a design method of the semiconductor integrated circuit in which four-phase clocks are wired.

FIG. 10 is a flowchart which shows a design method of the semiconductor integrated circuit 900 in which four-phase clocks are wired. In Steps 1001 to 1007, the same processing as in Steps 401 to 407 of the flowchart shown in FIG. 4 is performed. In Steps 1010 to 1014, the same processing as in Steps 408 to 412 of the flowchart shown in FIG. 4 is performed.

In the flowchart of FIG. 10, there is added processing related to transparency delay verification in which the overlaps of clocks, which is a feature of a domino circuit in which four-phase clocks are used, is considered. Steps 1008 and 1009 are added as processing before the arrangement of domino circuit cells and Steps 1015 to 1017 are added as processing after the arrangement of domino circuit cells. Even in a case where the number of stages of domino circuit cells exceeds a specified number of stages per clock cycle, the realization of the circuit is possible if the number of stages of all domino circuit cells is within a maximum allowable number of stages which is found from a delay time from the input to output of a required domino circuit block. Therefore, this calculation is made and a judgment is formed (Steps 1008 and 1009).

Also here, when the number of stages exceeds a specified number of stages, the processing returns to Step 1001 and an RTL modification is made. In Steps 1015 and 1016, in delay calculations after arranging each domino circuit cell on the semiconductor integrated circuit and carrying out wiring between the domino circuit cells, delay calculations of all of the domino circuit cells are similarly made and a judgment is formed as to whether the restrictions are met.

In actuality, in the delay calculations of Step 1015, it is necessary to meet the delay restrictions not only in delay time from the input to output of the domino circuit block, but also in all combinations of each of the four-phase clock signals (including all combinations of all clock signals distributed from the input to output of the domino circuit block, such as from CLK0 to CLK2, from CLK1 to CLK4, and further from CLK0 to CLK3 after one clock cycle, etc.).

The processing of Step 1017 is performed when there is a combination in which although the delay time from the input to output of the domino circuit block meets the restrictions, the delay time between the clock signals cannot meet the restrictions. That is, by changing a four-phase clock signal allocation to each domino circuit cell to a clock signal having a phase before or after the pertinent phase, the delay time restrictions between the clock signals are to be met.

In this case, rows of domino circuit cells to which four-phase clock signals are distributed and wired on the semiconductor integrated circuit 900 are determined beforehand. Therefore, when clock signals supplied to each domino circuit cells are changed, the arrangement of the domino circuit cell on the semiconductor integrated circuit must be changed. For this purpose, the processing returns to Step 1010, and the processing is carried out again from the arrangement of each domino circuit cell.

As described above, also for domino circuits in which four-phase clock signals are used, it is possible to automate the design. In the design technique of the present invention, by using four-phase clock signals, automated design makes it possible to increase the number of logic stages per clock cycle and raise operating frequencies when the number of logic stages is the same, compared to a case where two-phase clock signals are used.

Although the description has been made of an example in which overlapping four-phase clocks are used, it is obvious that the number of phases of clock signals is not limited so long as the clock signals overlap each other.

It is obvious that the design method of a semiconductor integrated circuit including a domino circuit cell array in accordance with each of the flowcharts of FIGS. 4 and 10 can be configured in such a manner that working procedures of the method are stored as a program beforehand in a recording medium, such as ROM, and read and executed by a CPU, which is a computer.

What is claimed is:

1. A semiconductor integrated circuit device, comprising:
a two-dimensional array of dynamic type logic circuit cells in which transistors constituting a logic section are in an unconnected condition; and
wiring for distributing a respective clock signal to each respective row of these dynamic type logic circuit cells,
wherein each of the dynamic type logic circuit cells has a precharge section, a clock gating section and a driving section in addition to the logic section and also transistors constituting respectively the precharge section, the clock gating section and the driving section are in an unconnected condition,
wherein the transistors constituting respectively the precharge section, the clock gating section and the driving section are brought into a connected condition in accordance with rule restrictions of a circuit, and
wherein the transistors constituting the driving section of a first dynamic logic circuit cell are connected based on a wiring length between the first dynamic logic circuit cell and a second dynamic logic circuit cell.

2. The semiconductor integrated circuit device according to claim 1, wherein for each of the dynamic type logic circuit cells, multiple kinds of logic configurations are possible according to a connection condition of the transistors.

3. The semiconductor integrated circuit device according to claim 1, wherein the dynamic type logic circuit cells are domino circuit cells.

4. The semiconductor integrated circuit device according to claim 1,
wherein, on each row of the two dimensional array, a clock wire is linearly arranged by use of respective row wires.

5. The semiconductor integrated circuit device according to claim 4,
further comprising:
a basic wiring layer; and
a row wiring layer comprising the respective row wires.

6. The semiconductor integrated circuit device according to claim 5,
wherein the dynamic type logic circuit cells comprise:
a front end layer comprising the transistors constituting a logic section.

7. The semiconductor integrated circuit device according to claim 1, wherein one clock signal is distributed to each row of the dynamic type logic circuit cells.

8. The semiconductor integrated circuit device according to claim 1, wherein a positive phase clock signal is distributed to a first set of rows and a negative phase clock signal is distributed to a second set of rows.

9. The semiconductor integrated circuit device according to claim 1, wherein a first clock signal is distributed to a first set of rows, a second clock signal having a phase which is delayed 90 degrees from the first clock signal is distributed to a second set of rows, a third clock signal having a phase which is delayed 180 degrees from the first clock signal is distributed to a third set of rows, and a fourth clock signal having a phase which is delayed 270 from the first clock signal is distributed to a fourth set of rows.

10. A semiconductor integrated circuit device, comprising:
a two-dimensional array of dynamic type logic circuit cells in which transistors constituting a logic section are in an unconnected condition; and
wiring for distributing a respective clock signal to each respective row of these dynamic type logic circuit cells,
wherein each of the dynamic type logic circuit cells has a precharge section, a clock gating section and a driving section in addition to the logic section and also transistors constituting respectively the precharge section, the clock gating section and the driving section are in an unconnected condition,
wherein the transistors constituting respectively the precharge section, the clock gating section and the driving section are brought into a connected condition in accordance with rule restrictions of a circuit, and
wherein a number of parallel rows of transistors in the precharge section and a number of parallel transistors of the clock gating section are brought into a connected condition based on a connection condition of the logic section.

11. The semiconductor integrated circuit device according to claim 10, wherein for each of the dynamic type logic circuit cells, multiple kinds of logic configurations are possible according to a connection condition of the transistors.

12. The semiconductor integrated circuit device according to claim 10, wherein the dynamic type logic circuit cells are domino circuit cells.

13. The semiconductor integrated circuit device according to claim 10,
wherein, on each row of the two dimensional array, a clock wire is linearly arranged by use of respective row wires.

14. The semiconductor integrated circuit device according to claim 13,
further comprising:
a basic wiring layer; and
a row wiring layer comprising the respective row wires.

15. The semiconductor integrated circuit device according to claim 14,
wherein the dynamic type logic circuit cells comprise:
a front end layer comprising the transistors constituting a logic section.

16. The semiconductor integrated circuit device according to claim 10, wherein one clock signal is distributed to each row of the dynamic type logic circuit cells.

17. The semiconductor integrated circuit device according to claim 10, wherein a positive phase clock signal is distributed to a first set of rows and a negative phase clock signal is distributed to a second set of rows.

18. The semiconductor integrated circuit device according to claim 10, wherein a first clock signal is distributed to a first set of rows, a second clock signal having a phase which is delayed 90 degrees from the first clock signal is distributed to a second set of rows, a third clock signal having a phase which is delayed 180 degrees from the first clock signal is distributed to a third set of rows, and a fourth clock signal having a phase which is delayed 270 from the first clock signal is distributed to a fourth set of rows.

* * * * *